(12) United States Patent
Huussen et al.

(10) Patent No.: US 9,343,304 B2
(45) Date of Patent: May 17, 2016

(54) METHOD FOR DEPOSITING FILMS ON SEMICONDUCTOR WAFERS

(71) Applicant: ASM IP Holding B.V., Almere (NL)

(72) Inventors: Frank Huussen, Almere (NL); Gijs Dingemans, Leuven (BE); Steven R. A. Van Aerde, Tielt-Winge (BE)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 14/497,577

(22) Filed: Sep. 26, 2014

(65) Prior Publication Data
US 2016/0093487 A1    Mar. 31, 2016

(51) Int. Cl.
*H01L 21/02*    (2006.01)
*H01L 21/285*   (2006.01)
*H01L 21/673*   (2006.01)

(52) U.S. Cl.
CPC ...... *H01L 21/0262* (2013.01); *H01L 21/02271* (2013.01); *H01L 21/02532* (2013.01); *H01L 21/02595* (2013.01); *H01L 21/28556* (2013.01); *H01L 21/67303* (2013.01)

(58) Field of Classification Search
None
See application file for complete search history.

(56) References Cited

U.S. PATENT DOCUMENTS 5,561,087 A    10/1996    Mikata

*Primary Examiner* — Yasser A Abdelaziez
(74) *Attorney, Agent, or Firm* — Lex IP Meister, PLLC

(57) ABSTRACT

An exemplary embodiment of the present invention provides a method of depositing of a film on semiconductor wafers. In a first step, a film thickness of 3 um or less is deposited on wafers accommodated in a wafer boat in a vertical furnace at a deposition temperature of the furnace while a deposition gas is flowing. During the first step, the temperature may be held substantially constant. In a second step, a temperature deviation or variation of at least 50° C. from the deposition temperature of the first step is applied and the furnace temperature is returned to the deposition temperature of the first step while the flow of the deposition gas is stopped. The first and second steps are repeated until a desired final film thickness is deposited.

18 Claims, 6 Drawing Sheets

FIG. 5
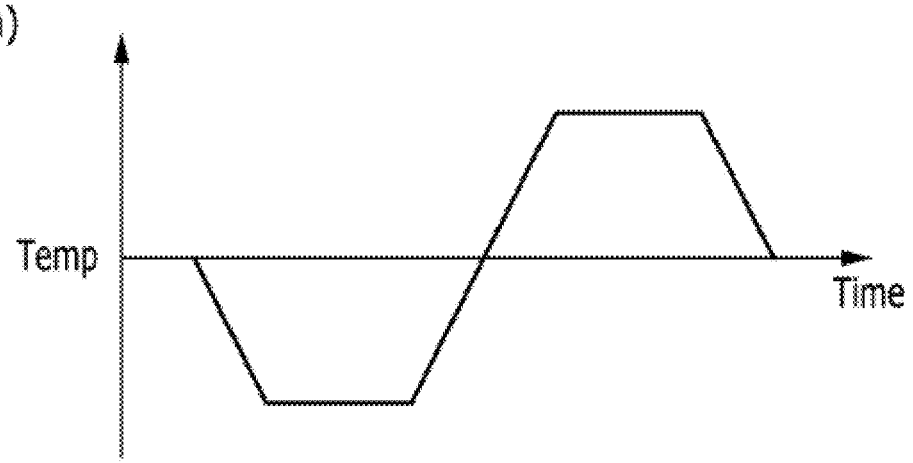
(a)
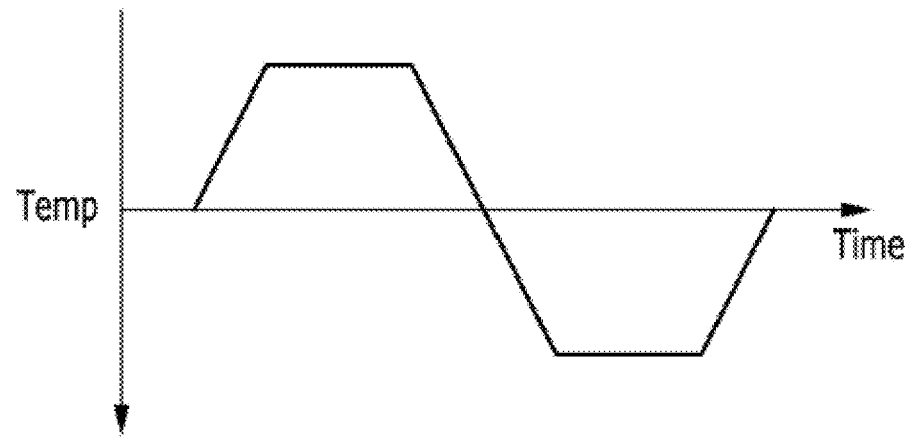
(b)

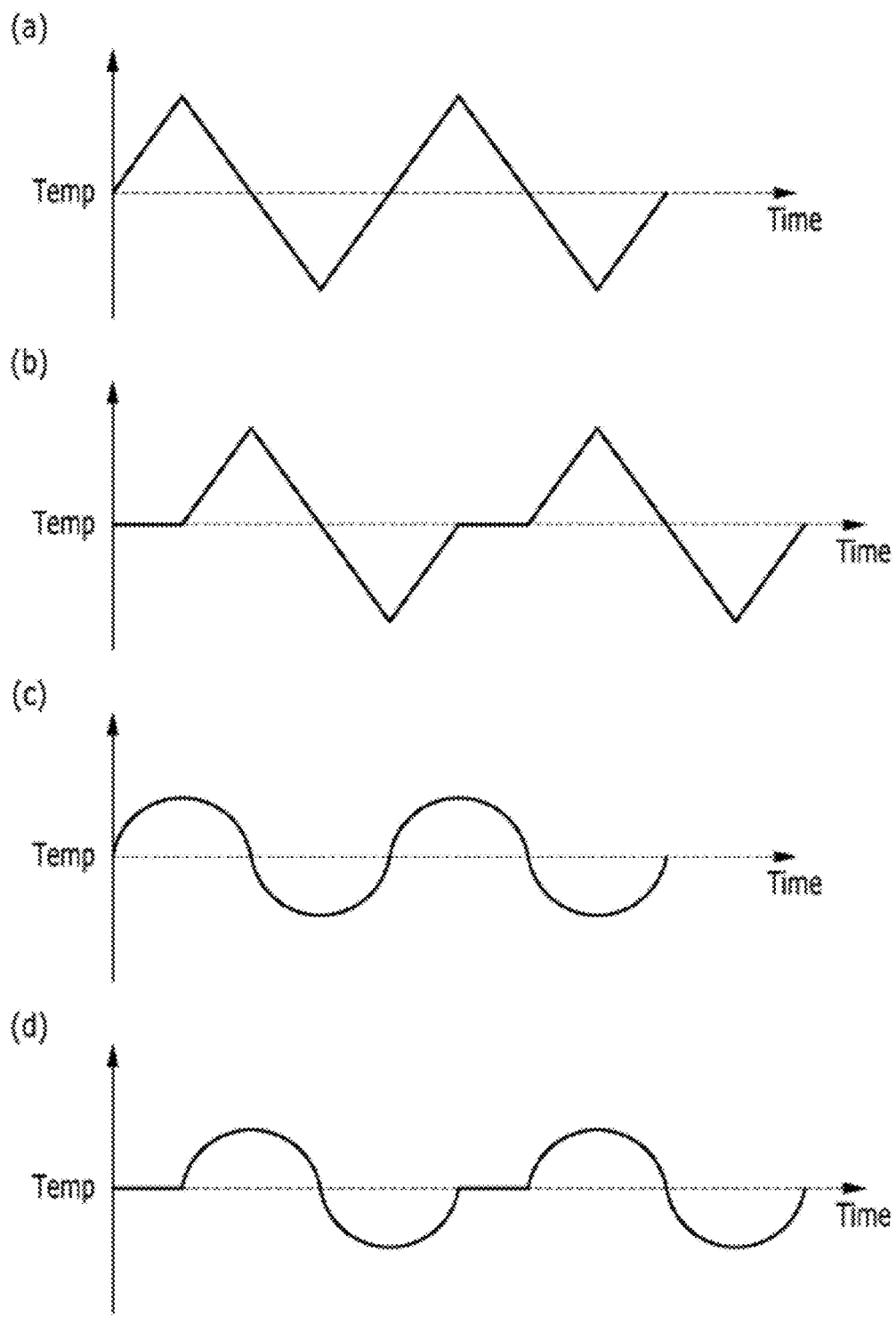

METHOD FOR DEPOSITING FILMS ON SEMICONDUCTOR WAFERS

BACKGROUND (a) Technical Field

The disclosure relates to a method for semiconductor wafer processing.

(b) Description of the Related Art

In vertical furnaces used for semiconductor wafer processing, a wafer boat may be used for accommodating a stack of vertically spaced apart wafers. Typically, as shown in FIG. 1, a conventional wafer boat 100 comprises two side rods 110A and one back rod 110B which extend vertically between a top member 120 and a bottom member 130. Each rod includes vertically spaced recesses 150 facing inwardly (i.e. generally towards a central axis of the wafer boat 100) along the length of rod. Each recess serves as a support arranged for engaging a circumferential side portion of a wafer, and recesses at a same height define a wafer accommodation for receiving and supporting a wafer in a substantially horizontal orientation. Wafers can be inserted into and removed from the boat at an open side of the boat, opposite of the back rod 110B.

Such wafer boats are used for oxidation diffusion processes but also for chemical vapor deposition processes. When the thickness of a film deposited in a batch furnace exceeds a few microns, the deposited film sticks the wafer onto the rods of the wafer boat. When the wafers are unloaded from the boat by a wafer handling robot, the wafer may remain attached to the boat, resulting in a wafer handling error or the wafer can be unloaded but is damaged during the process of separating the wafer from the boat. Parts of the wafer may break away during the separation process which is undesirable. One solution can be to limit the thickness of the film that is deposited in one run, unload the boat from the furnace and unload the wafers from the boat; then load the wafers into the boat again, load the boat into the furnace and carry out a next deposition process. This can be repeated until a desired cumulative film thickness is achieved. However, this is a time consuming process and not very efficient.

SUMMARY

Therefore, there is a need in the art for improved methods of depositing films on semiconductor wafers.

It is an objective of an embodiment to provide an efficient method for depositing thick films in a batch furnace without sticking the wafers onto the rods of the wafer boat and damaging the wafers during the unloading process.

The objective, features and advantages of the present invention are provided by methods of depositing films of a final desired thickness on semiconductor wafers in one run which do not require repeated and continuous loading and unloading of semiconductor wafers into a batch furnace so that the films have a final desired thickness.

According to one embodiment, in a first step, a film thickness of 3 um or less is deposited on wafers accommodated in a wafer boat in a vertical furnace at a deposition temperature of the furnace while a deposition gas is flowing. During the first step, the temperature may be held substantially constant. In a second step, a temperature deviation or variation of at least 50° C. from the deposition temperature of the first step is applied and the furnace temperature is returned to the deposition temperature of the first step while the flow of the deposition gas is stopped. The first and second steps are repeated until a desired final film thickness is deposited.

In another embodiment, a film is deposited with the deposition gas continuously flowing while the processing temperature is cycled during the deposition process with a temperature amplitude of at least 12.5° C. (above and below) around an average deposition temperature. At least one complete temperature cycle should be performed for each 3 um of deposited film.

BRIEF DESCRIPTION OF THE DRAWINGS

FIGS. 4, 5 and 6 are graphs illustrating examples of temperature deviation or variation applied to the embodiments of a process for depositing films on semiconductor wafers according to the present invention.

EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
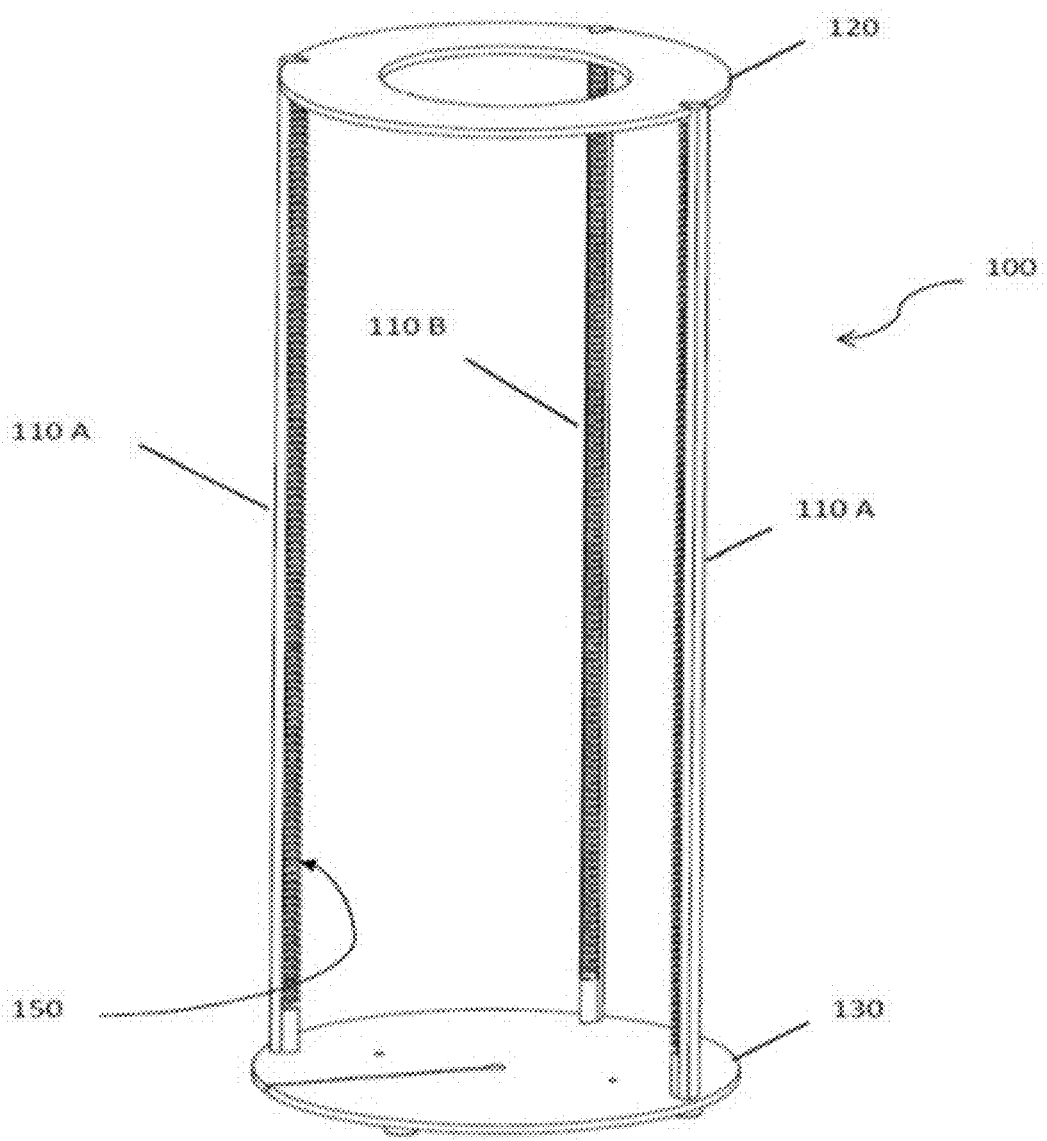
FIG. 1 shows a perspective view of a conventional wafer boat for holding a stack of vertically spaced apart semiconductor wafers.
Figure 2:
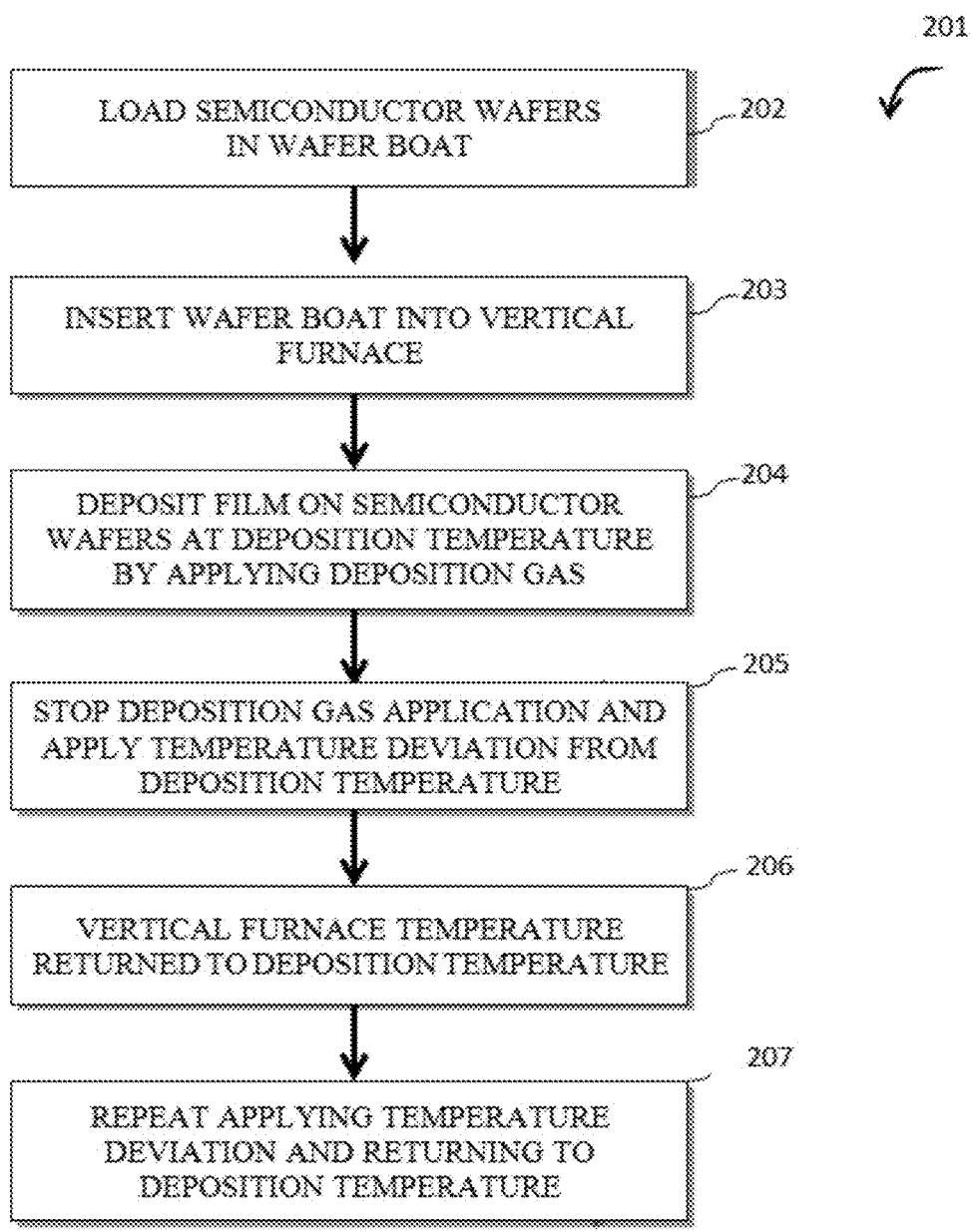
FIG. 2 is a flow diagram of an embodiment of a process for depositing films on semiconductor wafers according to the present invention.

Referring now to FIGS. 1 and 2, an embodiment of a method of depositing films on a plurality of semiconductor wafers will be described.

Figure 4:
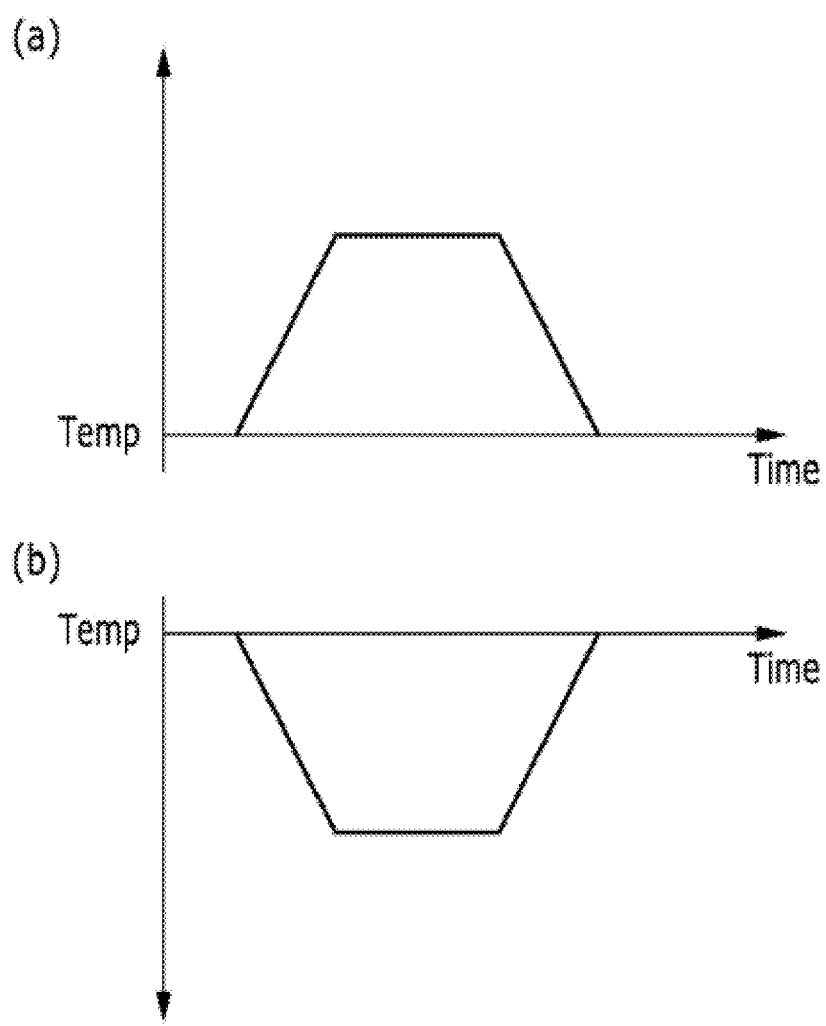

FIG. 2 depicts a flow diagram illustrating an embodiment of a process 201 for depositing films on semiconductor wafers according to the present invention. In 202, semiconductor wafers are loaded into a wafer boat 100. In 203, wafer boat 100 is inserted into a vertical furnace. In 204, a film of 3 um or less, preferably 2 um or less is deposited on semiconductor wafers accommodated in a wafer boat 100 in a vertical furnace at a deposition temperature while a deposition gas is applied to the semiconductor wafers. Examples of deposition gases include, but are not limited to, silanes such as $SiH_4$, $Si_2H_6$, $Si_3H_8$, and chlorosilanes such as $SiH_3Cl$, $SiH_2Cl_2$, $SiHCL_3$, $SiCl_4$, and $Si_2Cl_6$. In 205, application of the deposition gas is stopped and, at the same time, a temperature deviation of at least 25° C. from the deposition temperature is applied. The temperature deviation may be applied by increasing the vertical furnace temperature or decreasing the vertical furnace temperature from the deposition temperature as shown by FIG. 4. The temperature deviation may be applied by increasing the vertical furnace temperature after decreasing the vertical furnace temperature from the deposition temperature or vice versa as shown by FIGS. 5 and 6. In 206, the vertical furnace temperature is returned to the deposition temperature. The rate of the temperature decrease or increase from the deposition temperature may be varied. Preferably, the temperature deviation may be applied by decreasing the vertical furnace temperature from the deposition temperature to limit the thermal budget of the wafer. In 207, steps 205 and 206 are repeated until a final desired film thickness is obtained. Typically, the semiconductor wafer is of silicon material and the wafer boat of quartz material. Other wafer boat materials are possible such as silicon carbide.

Figure 3:
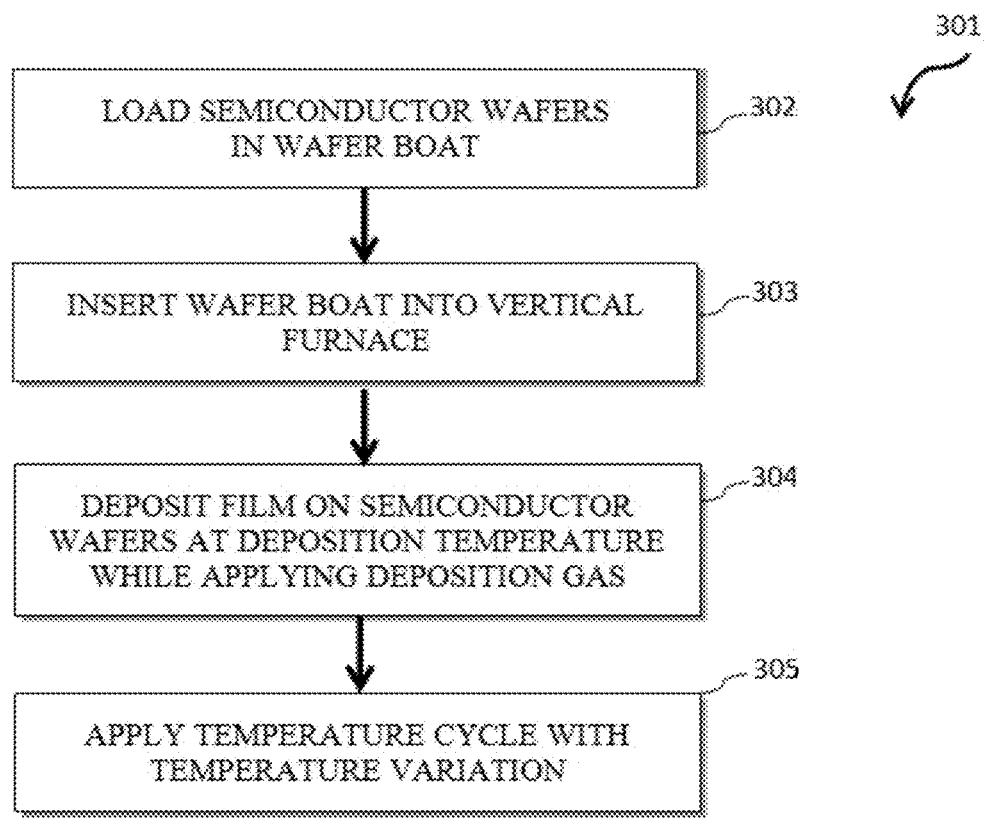
FIG. 3 is a flow diagram of another embodiment of a process for depositing films on semiconductor wafers according to the present invention.

FIG. 3 is a flow diagram of another embodiment of a method of depositing films on a plurality of semiconductor wafers.

Referring now to FIG. 3, the steps of 302, 303, and 304 are identical to the steps of 202, 203, and 204 of FIG. 2. However, as depicted by block 305, it is contemplated that the temperature cycle is applied during deposition of the film while the deposition gas remains flowing. The temperature cycle includes a heating phase and a cooling phase. The temperature may be varied with amplitude of at least 12.5° C. (above and below) around an average deposition temperature. The temperature variation may be a sinusoidal variation around the average deposition temperature or a triangular variation as shown by FIG. 6, or any other cyclical variation. The rate of the temperature decrease or increase from the deposition temperature may also be varied. At least one complete temperature cycle may be performed for each 3 um of deposited film, more preferably for each 2 um of deposited film, most preferably for each 1.5 um of deposited film. Preferably, the period of the temperature cycles is chosen such that a whole number of temperature cycles is performed between the start and the end of the deposition process.

The temperature deviation or variation results in a different thermal expansion of the silicon wafer and the quartz boat, because of their different coefficient of thermal expansion. Therefore, the wafer will move relative to the boat during the temperature deviation or variation. If such variation or deviation is applied before the wafer sticks to the boat, no damage occurs and a fresh starting position for the next deposition is created. When the temperature deviation or variation is applied when the wafer already sticks to the boat, the wafer breaks loose under influence of the temperature cycle and damage will occur.

Although the invention has been exemplified for polysilicon deposition, it is not limited to such and may also be applied for other films such as amorphous silicon, silicon carbide, silicon nitride and silicon oxide films.

It is contemplated that the temperature deviation or variation needed to prevent sticking of the wafer to the boat depends on the wafer size: a larger wafer needs a smaller temperature change to exhibit a certain amount of variation in size, measured in mm. In other words, the temperature change is inversely proportional to the wafer size. The following TABLE 1 may be proposed:

TABLE 1

| Wafer diameter (mm) | Temperature delta (° C.) |
|---|---|
| 150 | 120 |
| 200 | 75 |
| 300 | 50 |
| 450 | 25 |

The temperature delta is the difference between minimum and maximum temperature during the step depicted by block 205 of FIG. 2 and block 305 of FIG. 3, respectively. If a temperature deviation or variation from deposition temperature is applied in one direction (either a decrease or an increase in temperature), the minimum deviation as a function of wafer size may be suggested in the above TABLE 1. If the temperature deviation is applied in both directions, i.e. first a decrease of the furnace temperature below the deposition temperature followed by an increase of furnace temperature above the deposition temperature, then the difference between minimum and maximum temperature may be suggested by the above TABLE 1 and the deviations or variations from deposition temperature are half of the above values.

A variety of examples and comparative examples will be described hereinafter.

EXAMPLE 1

Polysilicon was deposited on semiconductor wafers at 680° C. with $SiH_4$ as the deposition gas. Polysilicon film of 1.5 um thickness was deposited on the semiconductor wafers by performing the step depicted by block 205 of FIG. 2. Then, the furnace temperature was lowered to 480° C. and raised to 680° C. again while the flow of $SiH_4$ was stopped as depicted by block 206 of FIG. 2. Then, the above steps were repeated two more times resulting in a cumulative final film thickness of 3×1.5 um=4.5 um. Practically no damage could be observed at the rear of the wafers.

EXAMPLE 2

Example 2 was performed under the same conditions as that of Example 1, but the steps depicted by blocks 205 and 206 of FIG. 2 were repeated five more times, resulting in a cumulative film thickness of 6×1.5 um=9 um. A very limited amount of scratches could be observed at the rear surface of the wafers.

EXAMPLE 3

Polysilicon was deposited on silicon wafers having a diameter of 200 mm at 680° C. from $SiH_4$ as the deposition gas. Polysilicon film of 2.5 um thickness was deposited on the silicon wafers by performing the step depicted by block 205 of FIG. 2. Then, the furnace temperature was lowered to 540° C. and raised to 680° C. again while the flow of $SiH_4$ was stopped. Then, the above steps were repeated one more time resulting in a cumulative film thickness of 2×2.5 um=5 um. No damage could be observed at the rear of the wafers.

EXAMPLE 4

Polysilicon was deposited on silicon wafers having a diameter of 200 mm at 650° C. from $SiH_4$ as the deposition gas. Polysilicon film of 2.5 um thickness was deposited on the silicon wafers by performing the step depicted by block 205 of FIG. 2. Then, the furnace temperature was lowered to 540° C. and raised to 650° C. again while the flow of $SiH_4$ was stopped as depicted by block 206 of FIG. 2. Then, the above steps were repeated one more time resulting in a cumulative film thickness of 2×2.5 um=5 um. No damage could be observed at the rear of the wafers.

COMPARATIVE EXAMPLE 1

In a comparative experiment, polysilicon film of 4 um thickness was deposited and then the quartz boat with wafers was unloaded into the room temperature minienvironment below the furnace and reloaded into the furnace again. The above steps were repeated two more times resulting in a 12 um cumulative film thickness. This sequence resulted in slight damage at the rear surface of the wafer.

COMPARATIVE EXAMPLE 2

In another comparative experiment, polysilicon film of 6 um thickness was deposited in one uninterrupted deposition run, wherein the temperature was held constant during the entire deposition run. This resulted in substantial damage at the rear surface of the wafer. Depending on the amount of damage that is acceptable, the film thickness deposited per cycle should be 4 um or less (slight damage acceptable), or 3 um or less (no damage).

What is claimed is:

1. A method of depositing of a film on semiconductor wafers, comprising performing the following steps:
   (a) loading a plurality of semiconductor wafers in a wafer boat;
   (b) inserting the wafer boat into a furnace;
   (c) depositing a film to have a thickness from 1.5 um to 4 um on the plurality of semiconductor wafers while applying a deposition gas to the plurality of semiconductor wafers at a substantial constant first temperature of the furnace;
   (d) applying a temperature deviation from the first temperature to the furnace while the application of the deposition gas to the plurality of semiconductor wafers is stopped;
   (e) restoring the furnace to the first temperature; and,
   (f) repeating step (c).

2. The method of claim 1, wherein the temperature deviation is applied by decreasing or increasing the temperature of the furnace from the first temperature.

3. The method of claim 2, wherein the temperature deviation makes a temperature change ranging from 25° C. to 120° C.

4. The method of claim 3, wherein the temperature change depends on a size of the wafers as specified in Table 1

TABLE 1

| Wafer diameter (mm) | Temperature change (° C.) |
| --- | --- |
| 150 | 120 |
| 200 | 75 |
| 300 | 50 |
| 450 | 25. |

5. The method of claim 2, wherein the temperature deviation is applied by decreasing the temperature of the furnace to the first temperature after increasing the temperature of the furnace above the first temperature or increasing the temperature of the furnace to the first temperature after decreasing the temperature of the furnace below the first temperature.

6. The method of claim 5, wherein the temperature deviation makes a temperature change ranging from 12.5° C. to 60° C. above and below the first temperature.

7. The method of claim 6, wherein the temperature change depends on a size of the wafers as specified in Table 1

TABLE 1

| Wafer diameter (mm) | Temperature change (° C.) |
| --- | --- |
| 150 | 120 |
| 200 | 75 |
| 300 | 50 |
| 450 | 25. |

8. The method of claim 1, wherein the temperature deviation is applied while the application of the deposition gas to the plurality of semiconductor wafers is continued.

9. The method of claim 8, wherein the temperature deviation is applied by decreasing the temperature of the furnace to the first temperature after increasing the temperature of the furnace above the first temperature or increasing the temperature of the furnace to the first temperature after decreasing the temperature of the furnace below the first temperature.

10. The method of claim 9, wherein the temperature deviation makes a temperature change ranging from 12.5° C. to 60° C. above and below the first temperature.

11. The method of claim 9, wherein the temperature change depends on a size of the wafers and is specified by Table 1

TABLE 1

| Wafer diameter (mm) | Temperature change (° C.) |
| --- | --- |
| 150 | 120 |
| 200 | 75 |
| 300 | 50 |
| 450 | 25. |

12. The method of claim 1, wherein the thickness of the film deposited is from 1.5 um to 3 um.

13. The method of claim 1, wherein step (f) comprises:
   repeating steps (c), (d) and (e) until a desired final film thickness is deposited on the semiconductor wafers.

14. The method of claim 1, wherein the wafer boat is of quartz material or silicon carbide.

15. A method of depositing a film on semiconductor wafers, comprising:
   (a) loading a plurality of semiconductor wafers in a wafer boat;
   (b) inserting the wafer boat into a vertical furnace;
   (c) applying a deposition gas to the semiconductor wafers; and
   (d) applying to the furnace a temperature variation cycle while the deposition gas is continuously applied,
   wherein at least one complete temperature variation cycle is performed for every 1.5 to 4 um film thickness deposited on the semiconductor wafers.

16. The method of claim 15, wherein the temperature variation cycle has an amplitude of at least 12.5° C. above and below from a median value of the temperature.

17. The method of claim 15, wherein the amplitude of the temperature variation cycle depends on a size of the semiconductor wafers and has a difference between a minimum and a maximum temperature of at least the values as specified in table 1

TABLE 1

| Wafer diameter (mm) | Temperature variation cycle (° C.) |
| --- | --- |
| 150 | 120 |
| 200 | 75 |
| 300 | 50 |
| 450 | 25. |

18. The method of claim 15, wherein the deposition gas is continuously applied during a heating phase of the temperature variation cycle.

* * * * *